United States Patent [19]
Williams

[11] Patent Number: 6,087,269
[45] Date of Patent: Jul. 11, 2000

[54] METHOD OF MAKING AN INTERCONNECT USING A TUNGSTEN HARD MASK

[75] Inventor: John David Williams, Austin, Tex.

[73] Assignee: Advanced Micro Devices, Inc., Sunnyvale, Calif.

[21] Appl. No.: 09/062,895

[22] Filed: Apr. 20, 1998

[51] Int. Cl.[7] .............................................. H01L 21/3065
[52] U.S. Cl. ................... 438/735; 438/736; 438/737; 438/742; 438/709; 438/720
[58] Field of Search ..................... 438/643, 738, 438/671, 685, 735, 720, 742, 736, 737, 709

[56] References Cited

U.S. PATENT DOCUMENTS

| | | | |
|---|---|---|---|
| 4,628,588 | 12/1986 | McDavid | 29/571 |
| 4,836,886 | 6/1989 | Daubenspeck | 216/75 |
| 4,917,759 | 4/1990 | Fisher | 438/625 |
| 5,534,462 | 7/1996 | Fiordalice et al. | 437/190 |
| 5,547,896 | 8/1996 | Linn et al. | 437/60 |
| 5,567,334 | 10/1996 | Baker et al. | 216/24 |
| 5,665,641 | 9/1997 | Shen | 438/671 |

OTHER PUBLICATIONS

Woo, Michel et al., "Tungsten Cap Metallization for 0.5 um Via Fill Technology," J. Electrochem. Soc., vol. 142, No. 11, pp. 3893–3895 Jan. 1995.

Woo, Michel et al., "Tungsten Cap Metallization for 0.5 um Via Fill Technology, " J. Electrochem. Soc., vol. 142, No. 11, Nov. 1995, pp. 3893–3895.

*Primary Examiner*—Benjamin L. Utech
*Assistant Examiner*—Binh X. Tran
*Attorney, Agent, or Firm*—Skjerven, Morrill, MacPherson, Franklin, Friel, L.L.P.; William W. Holloway

[57] ABSTRACT

An interconnect layer is fabricated using a tungsten hard mask by forming a tungsten based layer over an aluminum based layer. A photoresist layer is deposited over the tungsten based layer and patterned. The tungsten based layer is patterned by applying a fluorine-based etchant using the photoresist layer as an etch mask. Then the aluminum based layer is patterned by applying a chlorine based etchant using the tungsten based layer as an etch mask.

23 Claims, 2 Drawing Sheets

METHOD OF MAKING AN INTERCONNECT USING A TUNGSTEN HARD MASK

BACKGROUND OF THE INVENTION

1. Field of the Invention

This invention relates to integrated circuit manufacturing and more particularly, to forming an interconnect using tungsten as a hard mask.

2. Description of the Related Art

Current integrated circuit manufacturing processes typically use multiple levels of some form of metal interconnect to provide interconnections between various circuits on the integrated circuit. For instance, current manufacturing processes are known to use five levels of metal interconnects. The etch process to form the interconnect requires that precisely defined regions of metal be exposed to etchants in order to selectively remove material from those regions. The patterns that define the regions are typically created using lithographic processes. For instance, a layer of photoresist is spin-coated onto a substrate, and the resist layer is selectively exposed to a form of radiation, such as ultraviolet light, electrons, or x-rays.

An exposure tool and mask, or data tape in electron beam lithography, are used to effect the desired selective exposure. Openings in the resist corresponding to the selective exposure are formed in a subsequent development step. Next, an etch is applied, and the regions of the substrate exposed by the openings are removed. The etching provides a desired pattern in the metal layer to form the final usable interconnect.

Current lithographic processes are approaching the limits of the ability of to resolve minimum features that are adequate for a manufacturing process. Both line or space resolution and depth of focus are related to the numerical aperture and wavelength by the following expressions:

Resolution=$k1\lambda/NA$

Depth of Focus=$k2\lambda/NA^2$ where k1 and k2 are resist coefficients, $\lambda$ is the stepper wavelength and NA is the numerical aperture of the stepper. For a typical I line process, $\lambda$ is 365 mm, NA is 0.5 and k1 =0.65 and k2=1.0. Given these sets of conditions it is easily shown that limits for resolution and depth of focus values are already being stretched by the established 0.35 micron technology and emerging 0.25 micron technology.

The process limitations are further compounded by poor selectivity between metal and photoresist during a typical metal etch process. The photoresist performs two primary functions: precise pattern formation, and protection of the substrate during etch. Photoresist resolution refers to the ability of the photoresist to accurately match the pattern of the lithographic exposure equipment. Photoresist resolution is a key parameter that depends on several factors including the contrast, swelling, and thickness of the photoresist, as well as proximity effects (e.g., an isolated opening). As the photoresist becomes thicker, the openings near the bottom surface tend to narrow. As a result, thicker photoresist tends to limit the resolution. As the thickness of metal films are increased, thicker and thicker photoresist must be used in order to provide enough process margin during the etch. That is, in order to prevent excessive metal erosion during an etch, sufficient photoresist must be left over protected metal areas during the metal etch portion of the process. However, as resists become thicker, it becomes harder to resolve smaller features with an acceptable depth of focus.

Therefore, generally speaking, the resolution is improved by thinning the photoresist. That is, thinner resist allows extending standard exposure tools to finer geometries. However, the photoresist must remain thick enough to avoid metal being eroded by the etchant. For instance, for submicron patterns, the photoresist might be approximately 2 to 3 times as thick as an underlying metal layer in order to adequately protect the metal layer from an etchant that is particularly harsh to the photoresist. Unfortunately, at this thickness, the resolution of the photoresist may produce significant deviations between the desired pattern and the actual pattern transferred to the substrate. Accordingly, there exists a need for an efficient method of patterning metal layers forming interconnects using a thin layer of photoresist while adequately protecting the metal film from the etch.

SUMMARY OF THE INVENTION

Accordingly, the invention provides an improved method of fabricating a multilayer interconnect using a tungsten hard mask. In accordance with one embodiment of the invention, an interconnect structure is fabricated by forming a tungsten based layer over an aluminum based layer, depositing a photoresist layer over the tungsten based layer, patterning the photoresist layer, patterning the tungsten based layer by applying a fluorine-based etchant using the photoresist layer as an etch mask, and patterning the aluminum based layer by applying a chlorine based etchant using the tungsten based layer as an etch mask.

Use of the two step etch process exploits the etch selectivity difference between tungsten and aluminum and allows tungsten to advantageously operate as a hard mask, while reducing the thickness of the photoresist layer to provide improved metal pitch between metal layers.

BRIEF DESCRIPTION OF THE DRAWINGS

The present invention may be better understood, and its numerous objects, features, and advantages made apparent to those skilled in the art by referencing the accompanying drawings wherein depicted elements are not necessarily drawn to scale and wherein like or similar elements are designated by the same reference numerals throughout the several views.

DESCRIPTION OF THE PREFERRED EMBODIMENT(S)

Figure 1:
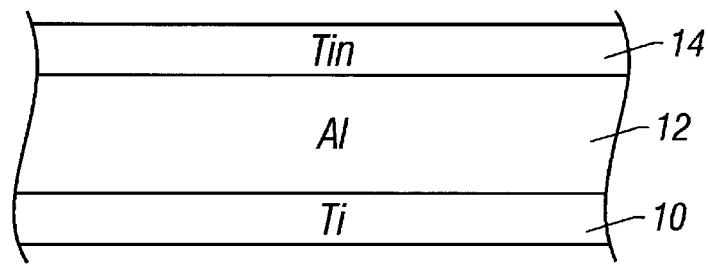
FIGS. 1–6 show cross-sectional views of successive process steps for creating a metal interconnect using tungsten as a hard mask.

Referring to FIGS. 1 through 6, cross sectional views are shown illustrating the process steps in accordance with the present invention to form a metal interconnect. In the illustrated embodiment, as shown in FIG. 1, an aluminum based layer 12 of approximately 2 microns is formed over substrate 10 which may be a 250 angstrom titanium based layer. Layer 10 may be either titanium (Ti), titanium nitride (TiN) or both. Aluminum based layer 12 may be aluminum or an aluminum alloy doped with such materials as copper. The aluminum based layer 12 is deposited on titanium based layer 10 by sputtering or evaporation.

Then a titanium based layer 14 is deposited on aluminum layer 12 using sputtering or evaporation. Layer 14, which serves as an adhesion layer, may be a graded Ti/TiN layer in which approximately the first 150 angstroms is Ti and the next 200 angstroms are TiN. In the illustrated embodiment the Ti/TiN layer 14 has a thickness of approximately 350 angstroms but may range from 150 to 500 angstroms. The graded Ti/TiN layer 14 also provides an antireflective layer for photolithography operations.

Figure 2:
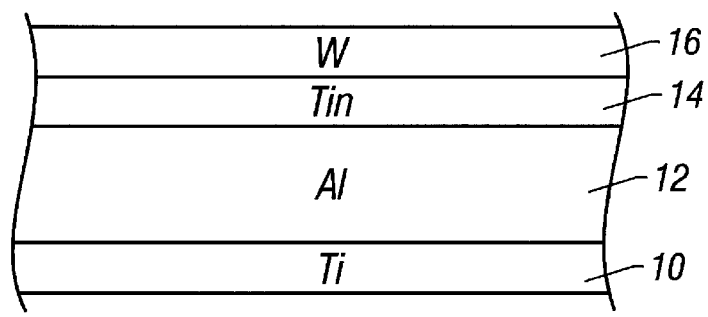

Referring to FIG. 2, a tungsten based layer 16 is conventionally deposited on TiN layer 14. The tungsten layer 14 has a thickness of approximately 2000 angstroms in the illustrated embodiment but may have a thickness in the range of 1000 angstroms to 3000 angstroms.

Figure 3:
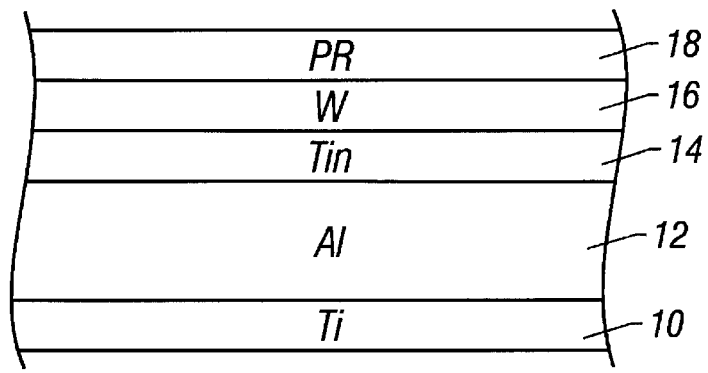

Referring to FIG. 3, a photoresist layer 18 is deposited on tungsten layer 16. The photoresist layer 18 has only to be of sufficient thickness to provide protection for tungsten layer 16, which is thinner than aluminum layer 12. Thus, the photoresist has to be in the range approximately 4000 to 12000 angstroms for a tungsten layer in the range of 1000 to 3000 angstroms. Note that the thickness of the photoresist is much thinner as compared to the thickness of photoresist that would be necessary if the aluminum were to be etched with the photoresist as an etch mask. In that case, the thickness of the photoresist may be two microns or more although the difficulty in resolving greater than two microns may limit the thickness of the photoresist and therefore the underlying metal layer and/or cause some of the metal to undesirably etched away. Thus, use of the tungsten provides the advantage of increased resolution because of the thinner resist as well as the possibility of increased interconnect thickness which provides for greater current handling capability.

Figure 4:
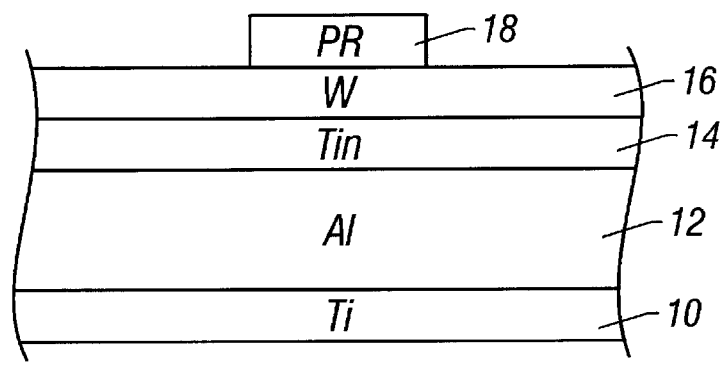

Referring to FIG. 4, photoresist 18 is patterned using conventional lithographic techniques. The selectivity between tungsten and aluminum is large enough that completely different etch chemistries must be used in order to properly remove these two films during plasma etching. Many current aluminum etches use BCL3 and CL2, while tungsten removal requires that a fluorine based etch such as SF6 chemistry be used. Thus, a two step etch process provides first a tungsten etch followed by an aluminum etch.

Figure 5:
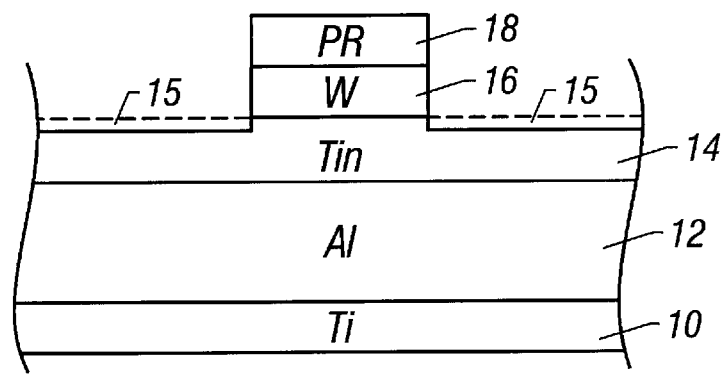
Figure 6:
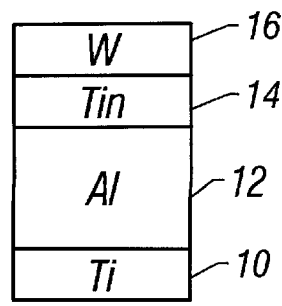

Referring to FIG. 5, the first step of the two step etch process is shown in which the tungsten hard mask is defined using the fluorine based etch. The fluorine based etch etches through a portion, but not all of photoresist 18. Note that a portion 15 of TiN layer 14 is etched during the fluorine based etch, although most of the TiN layer 14 is etched by the chlorine based etch. Referring to FIG. 6, once the tungsten hard mask is defined in the tungsten etch, the etch chemistry is switched to the aluminum etch with the tungsten layer providing the etch mask. The etch selectivity of the aluminum based layer to the tungsten based layer is approximately 4:1 when applying the chlorine based etchant.

The tungsten hard mask is readily conductive and may be used as part of the metal interconnect without being removed. Thus, a multilayer interconnect is formed which includes the aluminum layer 12 and the tungsten layer 16. The thickness of the aluminum layer can be greater than previously obtainable without fear of metal loss because of excessive resist erosion during the metal etch. Another advantage is the antireflecting nature of tungsten may allow the elimination of subsequent TiN anti reflective coatings (ARC) currently used as an ARC and an etch stop.

The description of the invention set forth herein is illustrative, and is not intended to limit the scope of the invention as set forth in the following claims. For instance, the multilayer interconnect could be utilized in all five or more metal interconnect levels present in the integrated circuit. Variations and modifications of the embodiments disclosed herein, may be made based on the description set forth herein, without departing from the scope and spirit of the invention as set forth in the following claims.

What is claimed is:

1. A method of fabricating a semiconductor device, the method comprising:

forming a first metal layer;

forming a graded titanium/titanium nitride layer over the first layer;

forming a second metal layer over the graded titanium/titanium nitride layer;

forming a patterned material over said second metal layer;

patterning the second metal layer using a first etchant to form a patterned second metal layer, the patterned material forming an etch mask; and patterning the first metal layer using a second etchant to form a patterned first metal layer, the patterned second metal layer forming an etch mask for patterning the first metal layer.

2. The method as recited in claim 1 wherein the first metal layer is an aluminum-based layer.

3. The method as recited in claim 1 wherein the second metal layer is a tungsten-based layer.

4. The method as recited in claim 1 wherein the patterned first metal layer and the patterned second metal layer form a multilayer interconnect.

5. The method as recited in claim 1 wherein the patterned material is a photoresist.

6. The method as recited in claim 1 wherein the second metal layer consists essentially of tungsten.

7. The method as recited in claim 1 wherein the first metal layer consists essentially of aluminum.

8. The method as recited in claim 1 further comprising:

implementing the patterned material with a photoresist layer;

applying the fluorine-based etchant to remove an upper portion of the photoresist layer; and applying the chlorine-based etchant to remove a lower portion of the photoresist layer, thereby completely removing the photoresist layer.

9. The method as recited in claim 1 wherein the first etchant is a fluorine-based etchant.

10. The method as recited in claim 4 wherein the second etchant is a chlorine-based etchant.

11. The method as recited in claim 1 wherein the etch selectivity of the first etchant is more selective of the second metal layer than the first metal layer and wherein the etch selectivity of the second etchant is more selective of the second metal layer than the first metal layer.

12. The method as recited in claim 11 wherein the etch selectivity of the first etchant is highly selective of the second metal layer as compared to the first metal layer and wherein the etch selectivity of the second etchant is highly selective of the second metal layer as compared to the first metal layer.

13. The method as recited in claim 12 wherein the first etchant is fluorine-based and the second etchant is chlorine-based.

14. A method of fabricating a multilayer interconnect, the method comprising:

forming a graded titanium/titanium nitride layer over an aluminum-based layer;

forming a tungsten based-layer over the graded titanium/titanium nitride layer;

depositing a photoresist layer over the tungsten-based layer;

patterning the photoresist layer;

patterning the tungsten-based layer by applying a fluorine-based etchant using the photoresist layer as an etch mask; and patterning the aluminum-based layer by applying a chlorine-based etchant using the tungsten-based layer as an etch mask.

15. The method as recited in claim 14, wherein the multilayer interconnect includes the patterned tungsten-based layer and the patterned aluminum-based layer.

16. The method as recited in claim 14 wherein the tungsten based-layer is formed with a thickness ranging from approximately 1000 angstroms to approximately 3000 angstroms.

17. The method as recited in claim 14 wherein the photoresist layer is formed with a thickness of less than approximately 12000 angstroms.

18. The method as recited in claim 14 wherein the photoresist layer is etched by both the fluorine- and the chlorine-based etchant.

19. The method as recited in claim 14 wherein the titanium/titanium nitride layer is etched by the chlorine-based etchant and the fluorine-based etchant.

20. The method as recited in claim 14 wherein the etch selectivity of the photoresist to the tungsten-based layer is approximately 1:1 or less, when applying the fluorine-based etchant.

21. The method as recited in claim 20 wherein the etch selectivity of the aluminum-based layer to the tungsten-based layer is approximately 4:1, when applying the chlorine-based etchant.

22. The method of claim 14, wherein the interconnect is used in fabricating an integrated circuit chip.

23. The method of claim 22, wherein the integrated circuit chip is a microprocessor residing in an electronic system, the electronic system including a memory and a system bus.

\* \* \* \* \*